Sept. 9, 1958 A. KÄCH 2,851,666

MICROWAVE FILTER WITH A VARIABLE BAND PASS RANGE

Filed June 19, 1953

INVENTOR:-
Alfred Käch,

BY

Pierce, Scheffler & Parker,
ATTORNEYS

United States Patent Office 2,851,666
Patented Sept. 9, 1958

2,851,666

MICROWAVE FILTER WITH A VARIABLE BAND PASS RANGE

Alfred Käch, Baden, Switzerland, assignor to "Patelhold" Patentverwertungs- & Elektro-Holding A.-G., Glarus, Switzerland, a joint-stock company Application June 19, 1953, Serial No. 362,708
Claims priority, application Switzerland June 20, 1952
3 Claims. (Cl. 333—73)

The present invention relates to a band pass filter for microwaves, and more particularly relates to a band pass filter for microwaves having a variable band pass range.

It is accordingly an object of the present invention to provide a band pass filter for microwaves which permits ready adjustment of the band pass characteristics of the filter.

It is a further object of the present invention to provide a band pass filter for microwaves having a variable band pass characteristic which is readily adjusted by a unitary control so as to vary the band pass characteristic of the various component circuits in unison with each other.

It is a still further object of the present invention to provide a band pass filter for microwave energy having a variable band pass characteristic which utilizes coaxial lines and tuned circuits which may be in the form of cavity resonators so as to achieve the desired characteristics.

It is well known that the realization of band pass filters which possess a substantially flat attenuation characteristic in the band pass region and a steep attenuation rise in the range of suppression or rejection of energy depends on the series connections of tuned circuits coupled in cascade. The form of the frequency response curve of the band pass filter depends predominantly on the number of tuned circuits, on the resonant frequency of the circuits and the degree of mutual coupling between the circuits.

It is relatively simple in connection with band pass filters having a plurality of tuned circuits to obtain a desired predetermined frequency response curve insofar as it relates to a fixed band pass range. If, however, a variable band pass characteristic is desired, then the resonant frequencies of all the tuned circuits must be varied in fixed unison within a larger frequency range. This requirement introduces the danger of intolerably great changes in those values which determine the frequency response curve for the band pass filters. As a result the practical realization encounters considerable difficulties of a mechanical and electrical nature, especially if no substantial reflections are to take place within the given band pass region. With filters used in the microwave range, the tuned circuits of which consist of cavity resonators, such band pass filters are usually of relatively great dimension and of relatively considerable weight. This is often taken as an obstacle to the practical application of the filters.

The present invention relates to a band pass filter for microwave energy with a variable band pass region which does not exhibit the above-named disadvantages. The filter in accordance with the present invention is characterized by a plurality of tuned circuit systems, of which each two consecutive ones are connected with each other by a portion of a transmission line, the length of which corresponds to a quarter wave-length at the mean frequency of the band of waves to be transmitted, whereby the resonant frequencies of the resonant systems lie within the band pass range of the filter and are at least substantially equal to each other and adjustable for the purpose of varying the band pass range.

In accordance with the present invention, the individual tuned circuits are therefore not used as four-poles mutually coupled, but are arranged at distances of each $\gamma_0/4$ as two-poles connected in parallel or series with the transmission line, wherein $\gamma_0$ is the mean frequency wave length of the resonant system.

Further objects and advantages in accordance with the present invention will be apparent from the following specification when taken with the accompanying drawing which shows, for purposes of illustration only, several preferred embodiments in accordance with the present invention, and wherein.

For a better understanding of the features of a filter in accordance with the present invention, the following theoretical analysis may be considered which sets forth the theoretical background for such filters.

For proper operation of a band pass filter in accordance with the present invention, it is essential that in the band pass region of the filter the individual tuned circuit systems are at least substantially near resonance and that these tuned circuits exhibit outside of the resonant range an extreme change of their impedance, which may be either inductive or capacitive.

Figure 1:
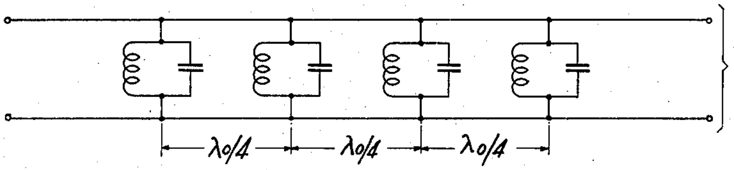
Fig. 1 is a schematic diagram of a filter in accordance with the present invention wherein the tuned circuits are connected in parallel.
Figure 2:
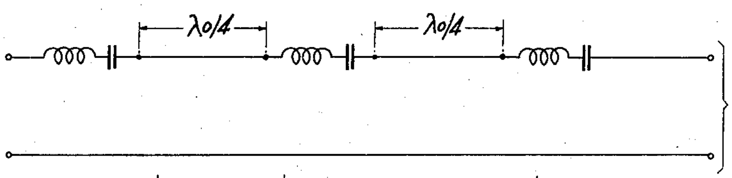
Fig. 2 is a schematic diagram of a filter in accordance with the present invention wherein the tuned circuits are connected in series.

At the resonant frequency, the impedances of the individual tuned circuits are all equal to each other and are very great with the arrangement in accordance with Fig. 1, while with the arrangement with Fig. 2 they are very small, as is well known with parallel and series connected tuned circuits. The passage of high frequency or microwave energy is thus always assured by the transmission line at the particular resonant frequency.

With changes in the frequency and therewith in the resonant impedance of the individual tuned circuit, the flow of energy over the transmission line is not immediately disturbed. Instead by reason of the transformer effect of the individual portions of the transmission line the existing mismatches are automatically corrected, as long as $jx \geqslant z_0$ obtains with an arrangement in accordance with Fig. 1, or $jx \leqslant z_0$ with an arrangement in accordance with Fig. 2, wherein $jx$ denotes the existing reactive component of impedance of an individual tuned circuit, and $z_0$ denotes the characteristic impedance of the transmission line. At all frequencies for which these relationships are satisfied, the tuned circuits or resonant systems have practically no influence on the band pass attenuation of the filter. Thus the width of the band pass of the filter depends mainly on the extent to which, with a change in frequency, the impedances $jx$ of the tuned circuits vary from their value at resonance up to a value of $z_0$ of the characteristic impedance of the transmission line.

The steepness or rise of the flanks of the band pass characteristic of the filter depends mainly on the number of resonant systems used. For frequencies which lie outside of the band pass range, i. e. for which $jx<z_0$ (Fig. 1), or $jx>z_0$ (Fig. 2) there obtains as a result of the transformer effect of the individual portions of the transmission line, a very great mismatch and therewith an extraordinary rejection or suppression effect is obtained.

The adjustment of the filter for a particular band pass frequency requires only the adjustment of each tuned circuit to a resonant frequency which corresponds to the mean frequency of the band pass range. In contrast to band-pass filters with coupled tuned circuits, the individual tuned circuits in accordance with the present invention are resonant at the same frequency. A further advantage for the maintenance of the synchronization of the tuned circuits with variation of the band pass range resides in that the mutual influence of the individual tuned circuits on each other is relatively small.

For the quality of the over all filter, the quality of each resonant system is decisive. In order to obtain relatively narrow resonant curves of the individual tuned circuits, transmission resonators or cavity resonators as well as lumped circuit element may be used. The resonant systems may advantageously be made in such a way that the point of the resonant frequency selected during the use of the filter corresponds to the fundamental wave. The first harmonic wave thus only appears at double or triple the frequency. A very good rejection effect is thereby obtained over a very large frequency range outside of the band pass range. With a given number of individual tuned circuits and a given band pass the filter in accordance with the present invention exhibits a greater steepness on the sides or flanks of the frequency response curve than would be possible to obtain with filters having coupled tuned circuits. Thus the filter in accordance with the present invention possesses improved properties with regard to electrical and mechanical consideration than is possible with known band pass filters.

With the use of a larger number of tuned circuit systems the frequency response curve of the filter is no longer flat in the band pass range but shows in its band pass range a wave-like or uneven characteristic which assumes intolerable proportions with as few as four tuned circuits in the filter. This unfavorable characteristic may, however, be easily removed. In order to achieve this, the characteristic impedances of the individual portions of the transmission line must be varied in an appropriate manner along the filter, and no longer all made equal to the characteristic impedance $z_0$. The individual transmission lines are instead made in accordance with the embodiment shown in Fig. 3 wherein the characteristic impedances are chosen differently so that they range from the center towards both ends of the filter in a symmetrical manner.

Figure 6:
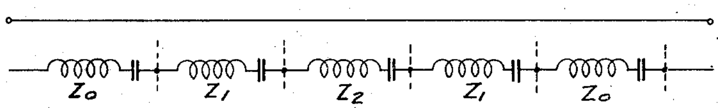
Fig. 6 is a schematic diagram of the graduated filter of Fig. 5.
Figure 3:
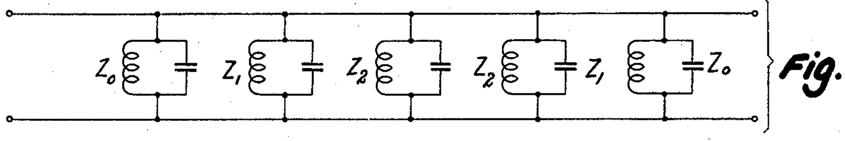
Fig. 3 is a schematic diagram of a filter with the individual tuned circuits connected in parallel and indicating the characteristic impedances of each of the tuned circuits in accordance with another embodiment of the present invention.

With a parallel connection, as shown in Figs. 1 and 3, the following relation must be established $z_0<z_1<z_2 \ldots$ and with a series connection in accordance with Figs. 2 and 6, the following must also hold true: $z_0>z_1>z_2 \ldots$ The filter thereby effectively acts as two opposed impedance transformers having quarter wave portions.

In connection with the arrangement shown in Fig. 3 which is used to flatten the band pass response curve of the filter, the overall impedance transformer ratio of the band pass filter remains 1:1 because of the symmetrical arrangement.

It is also possible by proper selection of the characteristic impedances of the various impedance transmission line portions to obtain an impedance tranformation by means of the filter. The filter then acts as a broad band quarter wave length transformer, i. e. it is possible to obtain in addition to the filtering effect at least over a certain range a simultaneous transformation of the characeristic impedance. In order to achieve this end, the characteristic impedances of the quarter wave length portions are to be change asymmetrically from one end to the other, thereby resulting in an asymmetric arrangement. This asymmetric arrangement may, of course, be combined with the aforementioned symmetrical arrangement so as to flatten or smooth out the frequency response curve of the band pass range of the filter in accordance with the present invention.

Figure 4:
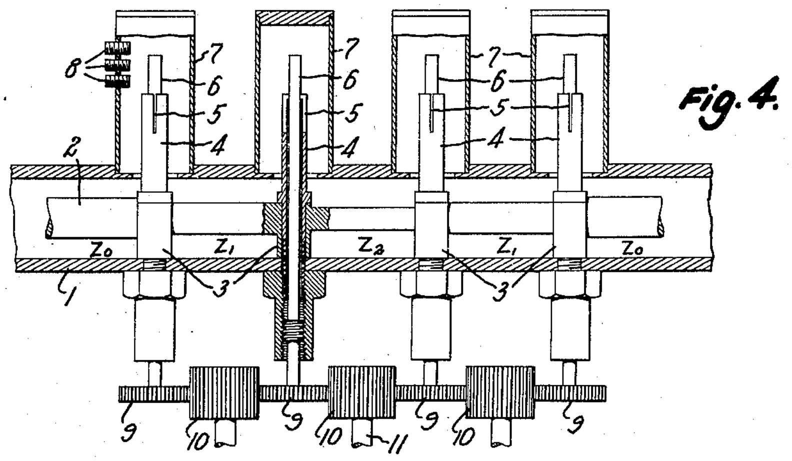
Figs. 4 and 5 are fragmentary views of practical embodiments of band pass filters as incorporated in coaxial transmission lines.

Referring now more particularly to Fig. 4, reference numeral 1 indicates the outer conductor and reference numeral 2 the inner conductor of a coaxial transmission line. These two conductors are connected with each other at distances of quarter wave lengths by means of cross connections 3. At the places of cross-connections, tubes 4 are used which pierce the inner conductor 2, and which are provided at their inner ends with a sliding contact formed by slot 5. The cross-connection 3 and the tube 4 of each resonant system are traversed by a tuning plug 6 which is axially adjustable by rotation in a threaded bore which, for example, may be provided by the cross-connection 3. Plug 6 forms over tube 4, with which it is in conducting contact, an open line up to the inner conductor 2 of a dimension somewhat smaller than a quarter wave length. This line thereby exhibits a somewhat capacitive impedance which is compensated by the inductive nature of the cross connection 3. The cross connection 3 and the tuning plug 6 in tube 4 thus form the real resonant system of each tuned circuit. The tubes 4 thus serve to place the sliding contact 5 approximately into the voltage antinode of the system so that practically no current is transmitted over the sliding contact. Each resonant system is surrounded with a tubular housing 7 in which tube 4 with tuning plug 6 represents the coaxial inner conductor. Further tuning elements, for example in the form of plugs 8 which may be more or less deeply threaded into the housing 7, permit a fine adjustment of the frequency of the individual resonant system for purposes of maintaining the electrical synchronization over a larger frequency range. The adjustment of the tuning plugs 6 is effected by means of gears 9 which are interconnected by means of gears 10. One of these gears is actuated by means of shaft 11 to obtain the desired simultaneous and unidirectional adjustment of all tuning plugs 6. In the exemplary embodiment, the characteristic impedances $z_1$ and $z_2$ of the quarter wave length portions are so chosen with respect to the characteristic impedance $z_0$ at the ends of the filter, that the filter does not show any uneven band pass characteristics in the range of its band pass region.

Figure 5:
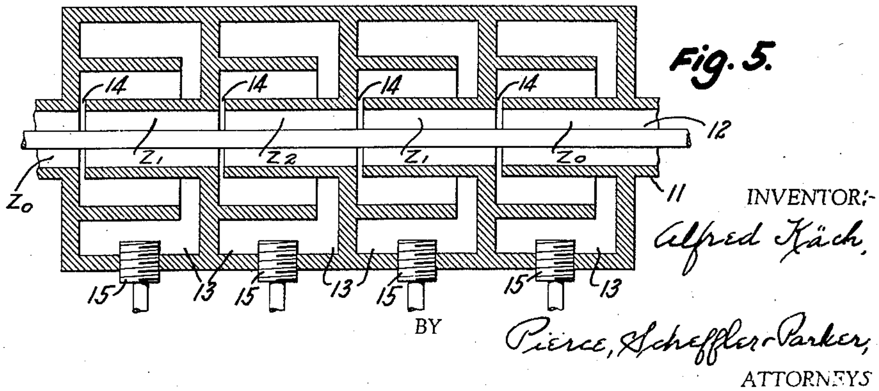

A practical embodiment for a filter with four series connected resonators in a series resonance circuit of a coaxial line is shown in Fig. 5. Reference numeral 11 identifies the outer conductor and reference numeral 12 the inner conductor of the coaxial line. Each of the resonators 13 comprises a bent line of a half wave length which is connected at point 14 with the coaxial transmission line. At the frequency for which the filter is to be used the gap at point 14 acts as a short-circuit. The points 14 follow each other along the transmission line at a distance of a quarter wave length at the resonant frequency. The resonant systems include tuning plugs 15 which are, for example, interconnected by means of a gearing arrangement, not shown but similar to that of Fig. 4, so that by actuating a single dial the unidirectional and simultaneous change of the resonant frequencies of the individual systems is effected.

I claim:

1. A band pass filter for microwaves with tunable band pass range comprising a plurality of resonant systems tuned to the same frequency, a coaxial transmission line section interconnecting each consecutive two of said resonant systems, the length of each of said transmission line sections corresponding to one-quarter wave length at the mean frequency of the band pass range of said filter, the characteristic impedances of said transmission line sections being graduated in steps symmetrically from the center of the filter towards both ends thereof, the resonant frequencies of said resonant systems being adjustable to vary the band pass range while maintaining the inductance to capacitance ratio of each of the resonant systems equal, said resonant systems each comprising a longitudinally adjustable tuning plug arranged at a right angle to the inner conductor of said coaxial transmission line, and a tubular housing surrounding each tuning plug, and gearing means interconnecting said tuning plugs simultaneously and unidirectionally varying the resonant frequencies of said resonant systems, whereby the resonant frequencies of all of said resonant systems are varied simultaneously and by approximately equal amounts by the longitudinal movements of said tuning plugs as a result of actuation of said gearing means.

2. A band pass filter according to claim 1 wherein the characteristic impedances of said transmission line sections decrease in value from the center toward the ends of said filter in a symmetrical manner.

3. A band pass filter as defined in claim 2 wherein the diameters of the inner conductors of said transmission line sections are graduated symmetrically.

References Cited in the file of this patent

UNITED STATES PATENTS

| | | |
|---|---|---|
| 1,849,656 | Bennett | Mar. 15, 1932 |
| 2,402,443 | Peterson | June 18, 1946 |
| 2,540,488 | Mumford | Feb. 6, 1951 |
| 2,697,209 | Sichak et al. | Dec. 14, 1954 |
| 2,749,523 | Dishal | June 5, 1956 |